US 11,817,865 B2

(12) United States Patent
You

(10) Patent No.: US 11,817,865 B2
(45) Date of Patent: Nov. 14, 2023

(54) OSCILLATOR

(71) Applicant: HUAWEI TECHNOLOGIES CO., LTD., Guangdong (CN)

(72) Inventor: Huancheng You, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/866,529

(22) Filed: Jul. 17, 2022

(65) Prior Publication Data

US 2022/0352897 A1 Nov. 3, 2022

Related U.S. Application Data

(63) Continuation of application No. PCT/CN2020/073604, filed on Jan. 21, 2020.

(51) Int. Cl.
*H03L 7/099* (2006.01)
*H03B 5/12* (2006.01)

(52) U.S. Cl.
CPC ........... *H03L 7/099* (2013.01); *H03B 5/1228* (2013.01)

(58) Field of Classification Search
CPC .................................................... H03B 5/1228
USPC ........................................................ 331/167
See application file for complete search history.

(56) References Cited

U.S. PATENT DOCUMENTS

| 10,749,470 B2 * | 8/2020 | Djahanshahi | ........ | H03B 5/1243 |
| 2011/0148534 A1 | 6/2011 | Lee et al. | | |
| 2017/0331430 A1 * | 11/2017 | Anand | ................. | H03B 5/1212 |

FOREIGN PATENT DOCUMENTS

| CN | 101359897 A | 2/2009 |
| CN | 103107811 A | 5/2013 |
| CN | 106571777 A | 4/2017 |
| CN | 109818576 A | 5/2019 |

OTHER PUBLICATIONS

Sheng Lyang Jang et al: "A complementary Colpitts VCO implemented with ring inductor", VLSI Design, Automation and Test, 2008. VLSI DAT 2008. IEEE International Symposium on, IEEE, Piscataway, NJ, USA, Apr. 23, 2008 (Apr. 23, 2008), pp. 125-127, XP031272451 ISBN: 978-1-4244-1616-5.

Sheng Lyang Jang et al: "A differential complementary hartley CMOS voltage controlled oscillator", Microwave Conference Proceedings (APMC), 2012 Asia-Pacific, IEEE, Dec. 4, 2012 (Dec. 4, 2012), pp. 1220-1222, XP032316404, DOI: 10.1109/APMC.2012. 6421875 ISBN: 978-1-4577-1330-9.

Heng-Chia Chang et al: "Phase Noise in Coupled Oscillators: Theory and Experiment", IEEE Transactions on Microwave Theory and Techniques, IEEE, USA, vol. 45, No. 5, May 1, 1997 (May 1, 1997) XP011036800, ISSN: 0018-9480.

* cited by examiner

*Primary Examiner* — Joseph Chang
(74) *Attorney, Agent, or Firm* — James Anderson Harrison

(57) ABSTRACT

An oscillator is provided. The oscillator includes two reverse amplification elements, and each of the reverse amplification elements forms a self-feedback structure by using an inductor. Output ends of the two reverse amplification elements are coupled to each other by using one or more inductors, and input ends of the two reverse amplification elements are coupled to each other by using a capacitor. A capacitance value of the capacitor may be adjusted, to change an oscillation frequency of a differential output oscillation signal output by the oscillator.

18 Claims, 10 Drawing Sheets

OSCILLATOR

CROSS-REFERENCE TO RELATED APPLICATIONS

This application is a continuation of International Application No. PCT/CN2020/073604, filed on Jan. 21, 2020, the disclosure of which is hereby incorporated by reference in its entirety.

TECHNICAL FIELD

This application relates to the field of electronic technologies, and in particular, to an oscillator.

BACKGROUND

A phase-locked loop (PLL) is an important unit in a communication device. For example, the phase-locked loop may be used as a clock generation circuit of various chips, microprocessors, digital circuits, and analog circuits, or used as a local oscillator circuit of a radio transceiver. A voltage-controlled oscillator (VCO) or digitally-controlled oscillator (DCO) needs to be used in the phase-locked loop. For a phase-locked loop using a voltage-controlled oscillator, performance of the voltage-controlled oscillator directly affects performance of an entire device. A radio transceiver is used as an example. A radio transceiver that works with a multi-mode chip in a device uses a multi-transmitter and multi-receiver architecture. In a multi-input multi-output (MIMO) working mode, a plurality of phase-locked loops need to work at the same time. For the voltage-controlled oscillator used in the phase-locked loop, phase noise performance is an important reference factor.

FIG. 1 shows a typical structure of a voltage-controlled oscillator in the conventional technology. The structure includes two cross-coupled N-type metal oxide semiconductor (NMOS) transistors M100 and M200, and two cross-coupled P-type metal oxide semiconductor (PMOS) transistors M300 and M400. Cross coupling of two transistors means that a gate of one transistor is coupled to a drain of the other transistor. Sources of the two NMOS transistors M100 and M200 are both grounded, sources of the two PMOS transistors M300 and M400 are both coupled to a reference voltage source VDD, a drain of the NMOS transistor M100 is coupled to a drain of the PMOS transistor M300, and a drain of the NMOS transistor M200 is coupled to a drain of the PMOS transistor M400. An inductor L100 is coupled between the two drains of the two PMOS transistors M300 and M400 and is connected in parallel with two capacitors C100 and C200 connected in series. The two capacitors C100 and C200 are adjustable capacitors, and capacitance values of the two capacitors are changed under control of a control voltage, to change an output oscillation frequency of the voltage-controlled oscillator.

However, the structure shown in FIG. 1 is not ideal for phase noise suppression, and cannot meet application requirements in some low-noise scenarios. Therefore, there exists a need for a voltage-controlled oscillator operable to suppress phase noise to achieve good performance.

SUMMARY

Embodiments of this application provide an oscillator, to achieve a good phase noise suppression effect.

In view of this, a first aspect of this application provides an oscillator. The oscillator includes: a first reverse amplification element, including a first input end and a first output end; a second reverse amplification element, including a second input end and a second output end; a first inductive element coupled between the first input end and the first output end; a second inductive element coupled between the second input end and the second output end; a third inductive element coupled between the first output end and the second output end; a first capacitive element, coupled between the first input end and the second input end and configured to receive a first control signal, where the first control signal is used to adjust a capacitance value of the first capacitive element; a first signal output end, coupled to the first inductive element and configured to output a first oscillation signal; and a second signal output end, coupled to the second inductive element and configured to output a second oscillation signal, where the first oscillation signal and the second oscillation signal jointly form a differential output oscillation signal.

In the foregoing technical solution, the two reverse amplification elements are configured as self-feedback structures. Compared with a conventional voltage-controlled oscillator having a cross-coupled structure, the oscillator provided in the first aspect of this application has higher current conversion efficiency. This helps suppress phase noise. The input ends of the two reverse amplification elements are coupled to each other by using a capacitive element, for example, a capacitor, so that an equivalent capacitance is doubled, signal energy is improved, and a better phase noise suppression feature is obtained.

With reference to the first aspect, in a first implementation of the first aspect, the first inductive element includes a first inductor, the second inductive element includes a second inductor, and the third inductive element includes a third inductor and a fourth inductor. The first reverse amplification element includes a first MOS transistor, the first input end is a gate of the first MOS transistor, the first output end is a drain of the first MOS transistor, a source of the first MOS transistor is configured to input a first reference voltage, and the third inductor is coupled between the first output end and a second node having a second reference voltage. The second reverse amplification element includes a second MOS transistor, the second input end is a gate of the second MOS transistor, the second output end is a drain of the second MOS transistor, a source of the second MOS transistor is configured to input the first reference voltage, and the fourth inductor is coupled between the second output end and the second node having the second reference voltage. Optionally, each of the first MOS transistor and the second MOS transistor may be a PMOS transistor or an NMOS transistor. For example, if a first reference voltage input by a source of a PMOS transistor is a reference voltage source, a second reference voltage is a ground voltage. For another example, if a first reference voltage input by a source of an NMOS transistor is a ground voltage, a second reference voltage is a reference voltage source. In this implementation, a single transistor is used to implement an amplification function, and a structure design is simple.

With reference to the first aspect, in a first implementation of the first aspect, the first inductive element includes a first inductor, the second inductive element includes a second inductor, and the third inductive element includes at least one third inductor. The first reverse amplification element includes a first CMOS inverter coupled between a first node having a first reference voltage and a second node having a second reference voltage. The second reverse amplification element includes a second CMOS inverter coupled between the first node having the first reference voltage and the second node having the second reference voltage. In this implementation solution, a CMOS inverter is used to implement an amplification function. This improves performance.

With reference to the first implementation of the first aspect, in a third implementation of the first aspect, the first inductor and the third inductor are formed in a first multi-port inductor, and the second inductor and the fourth inductor are formed in a second multi-port inductor.

With reference to the first aspect, in a fourth implementation of the first aspect, the first inductive element includes a first inductor and a fifth inductor, the second inductive element includes a second inductor and a sixth inductor, and the third inductive element includes a third inductor and a fourth inductor. The oscillator further includes: a third reverse amplification element, including a third input end and a third output end; a fourth reverse amplification element, including a fourth input end and a fourth output end; and a second capacitive element coupled between the third input end and the fourth input end. The first inductor is coupled between the first input end and the third output end, the second inductor is coupled between the second input end and the fourth output end, the third inductor is coupled between the first output end and the third input end, the fourth inductor is coupled between the second output end and the fourth input end, the fifth inductor is coupled between the first output end and the third output end, and the sixth inductor is coupled between the second output end and the fourth output end. This structure is equivalent to connecting the first reverse amplification element and the third reverse amplification element in series, and connecting the second reverse amplification element and the fourth reverse amplification element in series, so that the current utilization efficiency can be improved, a swing can be increased, and a noise suppression feature can be further improved.

With reference to the fourth implementation of the first aspect, in a fifth implementation of the first aspect, the second capacitive element is configured to receive a second control signal, where the second control signal is further used to adjust a capacitance value of the second capacitive element. In this solution, both the second capacitive element and the first capacitive element may receive different control signals to separately adjust capacitance values of the two capacitive elements, to adjust an output signal frequency of the oscillator, and improve adjustment flexibility. Alternatively, the capacitance value of the second capacitive element may be nonadjustable.

With reference to the fourth implementation or the fifth implementation of the first aspect, in a sixth implementation of the first aspect, the first capacitive element and the second capacitive element each include at least one of a variable capacitor, a switch-capacitor network, or a variable capacitor diode.

With reference to any one of the fourth implementation to the sixth implementation of the first aspect, in a seventh implementation of the first aspect, the first reverse amplification element includes a first MOS transistor, the first input end is a gate of the first MOS transistor, the first output end is a drain of the first MOS transistor, and a source of the first MOS transistor is configured to input a first reference voltage. The second reverse amplification element includes a second MOS transistor, the second input end is a gate of the second MOS transistor, the second output end is a drain of the second MOS transistor, and a source of the second MOS transistor is configured to input the first reference voltage. The third reverse amplification element includes a third MOS transistor, the third input end is a gate of the third MOS transistor, the third output end is a drain of the third MOS transistor, a source of the third MOS transistor is configured to input a second reference voltage, and the third MOS transistor and the first MOS transistor are complementary transistors. The fourth reverse amplification element includes a fourth MOS transistor, the fourth input end is a gate of the fourth MOS transistor, the fourth output end is a drain of the fourth MOS transistor, a source of the fourth MOS transistor is configured to input the second reference voltage, and the fourth MOS transistor and the second MOS transistor are complementary transistors. Optionally, that two transistors are complementary transistors means that one transistor is a PMOS transistor, and the other transistor is an NMOS transistor. Therefore, when the first MOS transistor and the second MOS transistor are PMOS transistors, the third MOS transistor and the fourth MOS transistor are NMOS transistors; and when the first MOS transistor and the second MOS transistor are NMOS transistors, the third MOS transistor and the fourth MOS transistor are PMOS transistors. For example, a reference voltage input by a source of a PMOS transistor is a reference voltage source, and a reference voltage input by a source of an NMOS transistor is a ground voltage.

With reference to any one of the fourth implementation to the sixth implementation of the first aspect, in an eighth implementation of the first aspect, the first reverse amplification element includes a first CMOS inverter coupled between a first node having a first reference voltage and a second node having a second reference voltage. The second reverse amplification element includes a second CMOS inverter coupled between the first node having the first reference voltage and the second node having the second reference. The third reverse amplification element includes a third CMOS inverter coupled between the first node having the first reference voltage and the second node having the second reference voltage. The fourth reverse amplification element includes a fourth CMOS inverter coupled between the first node having the first reference voltage and the second node having the second reference voltage.

With reference to any one of the fourth implementation to the eighth implementation of the first aspect, in a ninth implementation of the first aspect, the first inductor, the third inductor, and the fifth inductor are formed in a first multi-port inductor, and the second inductor, the fourth inductor, and the sixth inductor are formed in a second multi-port inductor. The foregoing solution is easy to implement.

With reference to the third implementation or the ninth implementation of the first aspect, in a tenth implementation of the first aspect, the first multi-port inductor and the second multi-port inductor are cross-arranged in a layout. This arrangement manner helps improve an anti-interference capability and reduce energy leakage of the inductors.

With reference to the first aspect to the tenth implementation of the first aspect, in an eleventh implementation of the first aspect, the first control signal or the second control signal may be a voltage signal or a digital signal. An oscillator to which the voltage signal is applied is a voltage-controlled oscillator. An oscillator to which the digital signal is applied is a digital-analog mixed oscillator.

A second aspect of this application provides a parallel structure of an oscillator, including a plurality of oscillators according to any one of the first aspect to the third implementation of the first aspect. A plurality of first input ends of the plurality of oscillators are coupled to each other, and a plurality of second input ends of the plurality of oscillators are coupled to each other. This parallel structure can further reduce noise and improve performance.

A third aspect of this application provides a phase-locked loop, including the oscillator according to any one of the first aspect to the tenth implementation of the first aspect, or the parallel structure of the oscillator according to the second aspect.

A fourth aspect of this application provides a semiconductor chip, including the oscillator according to any one of the first aspect to the tenth implementation of the first aspect, or the parallel structure of the oscillator according to the second aspect, or the phase-locked loop according to the third aspect. Optionally, the semiconductor chip is a radio frequency chip.

A fifth aspect of this application provides a communication device, including the oscillator according to any one of the first aspect to the tenth implementation of the first aspect, or the parallel structure of the oscillator according to the second aspect, or the phase-locked loop according to the third aspect, or the semiconductor chip according to the fourth aspect.

The foregoing aspects or the possible implementations of this application are clearer and more comprehensible in descriptions of the following embodiments.

DESCRIPTION OF EMBODIMENTS

To make a person skilled in the art better understand the technical solutions provided in embodiments of this application, the following clearly describes the technical solutions in embodiments of this application with reference to the accompanying drawings in embodiments of this application. It is clear that the described embodiments are merely some but not all of embodiments of this application. In embodiments of the specification, claims, and accompanying drawings of this application, the terms "first", "second", "third", and so on are intended to distinguish between similar objects but do not necessarily indicate a specific order or sequence. Therefore, a feature limited by "first", "second", or "third" may explicitly or implicitly include one or more features. In the descriptions of this application, unless otherwise stated, "a plurality of" means two or more than two. In addition, the term "include" and any other variants mean to cover a non-exclusive inclusion, for example, include a series of modules or units. The term "coupling" described in embodiments may be used to implement interconnection between different elements, components, or modules, and includes any electrical connection manner, for example, a manner of direct contact or a connection through a conducting wire or another component.

Figure 2:
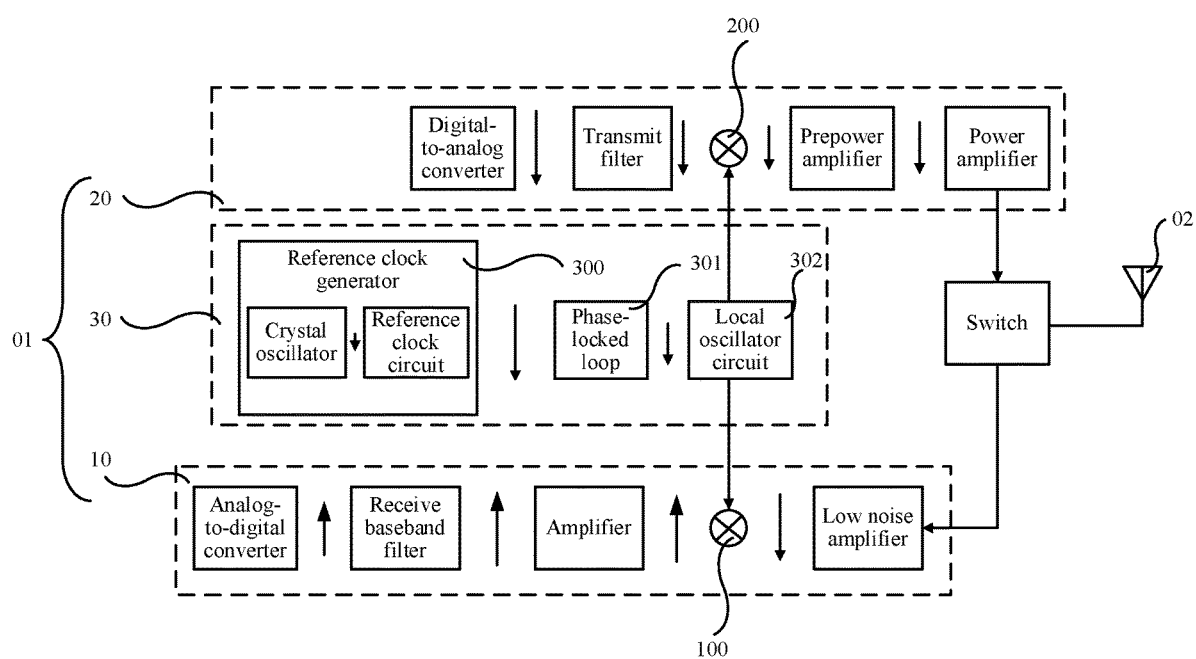
FIG. 2 is a schematic diagram of a radio frequency circuit according to an embodiment of this application.

An embodiment of this application provides a communication device. The communication device may be a terminal, a wireless router, a wireless access point, a base station, a point-to-point communication device, a short-range communication device, or another wireless communication device. The terminal includes but is not limited to a mobile phone, a tablet computer, a wearable device, an in-vehicle device, or an Internet of Things device. The wireless communication device may include a radio frequency circuit inside. In an example, as shown in FIG. 2, the radio frequency circuit 01 may be configured to receive and send a radio signal. The radio frequency circuit 01 may also be referred to as a radio transceiver.

The radio frequency circuit 01 is coupled to an antenna 02. In this case, as shown in FIG. 2, the radio frequency circuit 01 includes a receive path 10 used for receiving a signal on the antenna 02 and a transmit path 20 used for sending a signal to the antenna 02. The receive path 10 includes a low noise amplifier (LNA), a first frequency mixer 100, an amplifier (AMP), a receive (RX) baseband filter, and an analog-to-digital converter (ADC). The receive path 10 is configured to convert a received radio frequency carrier signal on the antenna 02 into an intermediate frequency signal or a baseband signal in a digital domain. The transmit path 20 includes a digital-to-analog converter (DAC), a transmit filter, a second frequency mixer 200, a prepower amplifier (PPA), and a power amplifier (PA). The transmit path 20 is configured to convert the intermediate frequency signal or the baseband signal in the digital domain into the radio frequency carrier signal that can be sent on the antenna 02.

In addition, as shown in FIG. 2, the radio frequency circuit 01 further includes a local oscillator generation circuit 30. The local oscillator generation circuit 30 is coupled to the first frequency mixer 100 in the receive path 10 and the second frequency mixer 200 in the transmit path 20. The local oscillator generation circuit 30 is configured to provide, for the receive path 10, a local oscillator signal required for demodulation. A frequency of the foregoing local oscillator signal is mixed with a frequency of a radio frequency carrier signal that is transferred by the antenna 02 and that is received by the first frequency mixer 100 in the receive path 10, to convert the two signals into an intermediate frequency signal or a baseband signal. This implements signal demodulation. The local oscillator generation circuit 30 is further configured to provide, for the transmit path 20, a local oscillator signal required for modulation. A frequency of the foregoing local oscillator signal is mixed with a frequency of an intermediate frequency signal or a baseband signal that is output by the transmit filter in the transmit path 20, to convert the intermediate frequency signal or the baseband signal to a radio frequency carrier signal that can be sent through the antenna 02. This implements signal modulation. Optionally, although FIG. 2 shows only one local oscillator generation circuit 30, actually, two local oscillator generation circuits may alternatively be used, so that each local oscillator generation circuit serves one of the receive path 10 or the transmit path 20, instead that the receive path 10 and the transmit path 20 share one local oscillator generation circuit as shown in FIG. 2. This is not limited in this embodiment.

As shown in FIG. 2, the foregoing local oscillator generation circuit 30 includes a reference clock generator 300 configured to generate a reference clock signal. The reference clock generator 300 includes a crystal oscillator configured to generate a basic clock and a reference clock circuit coupled to the crystal oscillator. The reference clock circuit may generate a reference clock based on the basic clock. The local oscillator generation circuit 30 further includes a phase-locked loop 301 coupled to the reference clock generator 300.

The phase-locked loop 301 can obtain a phase difference between an input signal and an output signal O, as shown in greater detail in FIG. 3 below, to control a frequency and a phase of an oscillation signal in a loop of the phase-locked loop 301, so that the phase-locked loop 301 outputs the output signal O with a preset stable frequency. The input signal is the reference clock output by the reference clock generator 300. The phase-locked loop 301 may be configured to output the output signal O based on a frequency of the reference clock signal output by the reference clock generator 300.

In addition, to enable a modulation signal and a demodulation signal that are output by the local oscillator generation circuit 30 to meet a product requirement, the local oscillator generation circuit 30 further includes a local oscillator (LO) circuit 302 coupled to the phase-locked loop 301. The local oscillator circuit 302 can perform, based on a requirement of the communication device, frequency division and phase processing on a frequency output by the phase-locked loop 301, to finally generate local oscillator signals that are used as the modulation signal and the demodulation signal.

Figure 3:
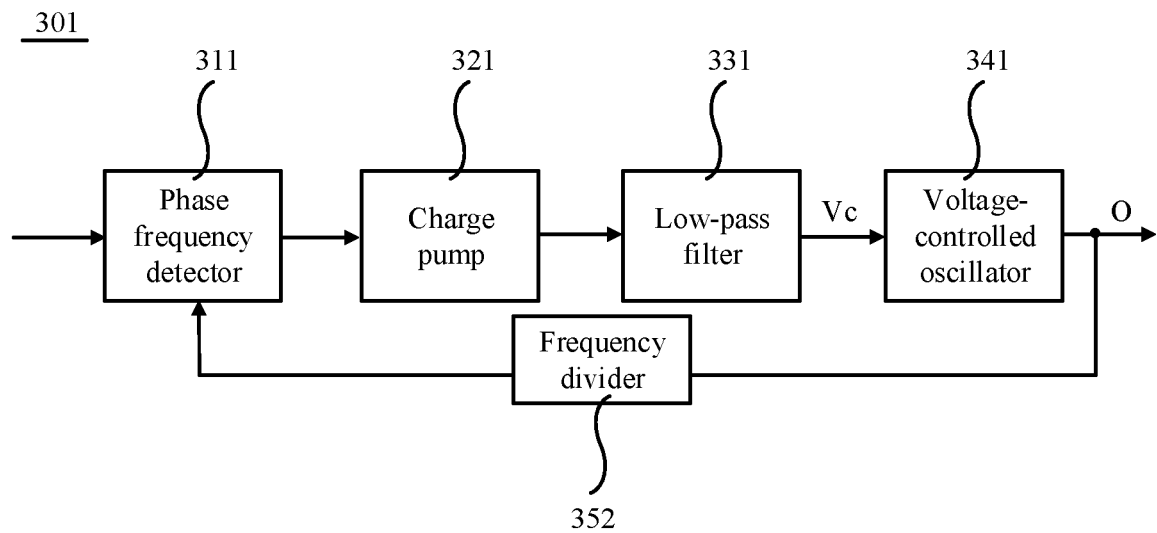
FIG. 3 is a schematic diagram of a structure of a phase-locked loop according to an embodiment of this application.

As shown in FIG. 3, the phase-locked loop 301 includes a phase frequency detector (PFD) 311, a charge pump (CP) 321, a low-pass filter (LF) 331, a voltage-controlled oscillator (VCO) 341, and a frequency divider 352 operably coupled as shown. The phase frequency detector 311 can obtain, based on the reference clock provided by the reference clock generator 300, a phase difference between the reference clock and a clock signal that is output by the frequency divider 352 after frequency division, and provide a pulse control signal for the charge pump 321 based on the phase difference. The charge pump 321 generates, based on the pulse control signal, a current signal matching the phase difference. The current signal can charge and discharge the low-pass filter 331. The low-pass filter 331 generates, based on the current signal input by the charge pump 321, a control voltage Vc for controlling the voltage-controlled oscillator 341. After receiving the control voltage Vc input by the low-pass filter 331, the voltage-controlled oscillator 341 may generate the output signal O with a corresponding frequency based on the control voltage Vc. In addition, after frequency division processing is performed on the output signal O of the voltage-controlled oscillator 341 by the frequency divider 352 in a feedback loop, the output signal O is transmitted to the phase frequency detector 311. In this case, a frequency of the output signal O of the phase-locked loop 301 gradually matches the frequency of the reference clock signal provided by the reference clock generator 300, to achieve an objective of stabilizing the output signal O. The phase-locked loop 301 shown in FIG. 3 is an analog phase-locked loop, but FIG. 3 is merely used as an example. It may be understood that the phase-locked loop 301 may alternatively be a digital phase-locked loop or a digital-analog mixed phase-locked loop. This is not limited in this embodiment.

The radio frequency circuit 01 may be disposed in one or more semiconductor chips. For example, the phase-locked loop 301 may be located in a same semiconductor chip with the receive path 10 and the transmit path 20. Optionally, the semiconductor chip is a radio frequency chip. Alternatively, the phase-locked loop and the receive path 10 or the transmit path 20 may be located in different semiconductor chips. In the radio frequency circuit 01, noise and pulling performance of the voltage-controlled oscillator 341 in the phase-locked loop 301 affect performance of the phase-locked loop 301 to a great extent, and further affect performance of the entire radio frequency circuit 01. Therefore, how to design a voltage-controlled oscillator having good noise and pulling suppression performance is crucial. A high-performance voltage-controlled oscillator not only can be well used in the radio frequency circuit 01 mentioned in this embodiment, but also can be used in another application scenario.

Figure 4:
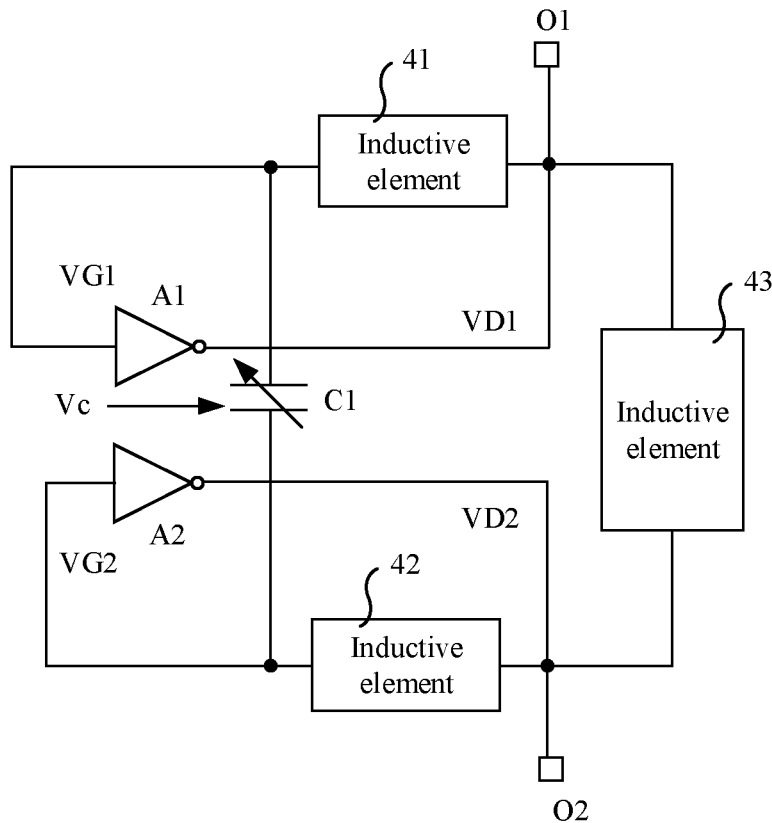
FIG. 4 is a schematic diagram of a voltage-controlled oscillator according to an embodiment of this application.

In an embodiment of this application, FIG. 4 is a schematic diagram of an implementation solution of a voltage-controlled oscillator. The voltage-controlled oscillator includes a first reverse amplification element A1, a second reverse amplification element A2, a first inductive element 41, a second inductive element 42, a third inductive element 43, and a first capacitor C1. The first reverse amplification element A1 includes a first input end VG1 and a first output end VD1. The second reverse amplification element A2 includes a second input end VG2 and a second output end VD2. The first inductive element 41 is coupled between the first input end VG1 and the first output end VD1. The second inductive element 42 is coupled between the second input end VG2 and the second output end VD2. The third inductive element 43 is coupled between the first output end VD1 and the second output end VD2. The first capacitor C1 is coupled between the first input end VG1 and the second input end VG2, and is configured to receive a first voltage signal Vc. The first voltage signal Vc is a first control signal, namely, the foregoing mentioned control voltage in the phase-locked loop, and is used as an input voltage of the voltage-controlled oscillator, to adjust a capacitance value of the first capacitor C1. A first signal output end O1 is coupled to the first inductive element 41 and configured to output a first oscillation signal. A second signal output end O2 is coupled to the second inductive element 42 and configured to output a second oscillation signal. The first signal output end O1 and the second signal output end O2 are symmetrically disposed, so that the first oscillation signal and the second oscillation signal form a differential output oscillation signal used as an output signal O of the voltage-controlled oscillator. A frequency of the differential output oscillation signal varies with the capacitance value of the first capacitor C1. Therefore, the frequency of the differential output oscillation signal is controlled by the first voltage signal Vc. Positions of disposing the first signal output end O1 and the second signal output end O2 may be flexibly adjusted. For example, in FIG. 4, the first signal output end O1 is located between the first inductive element 41 and the third inductive element 43, in other words, is coupled to the first output end VD1. Alternatively, the first signal output end O1 may be located on the first inductive element 41 or coupled to the first input end VG1. In FIG. 4, the second signal output end O2 is coupled between the second inductive element 42 and the third inductive element 43, in other words, is coupled to the second output end VD2. Alternatively, the second signal output end O2 may be coupled to the second inductive element 42 or coupled to the second input end VG2. Each inductive element in the foregoing embodiment may include one or more inductors.

Figure 1:
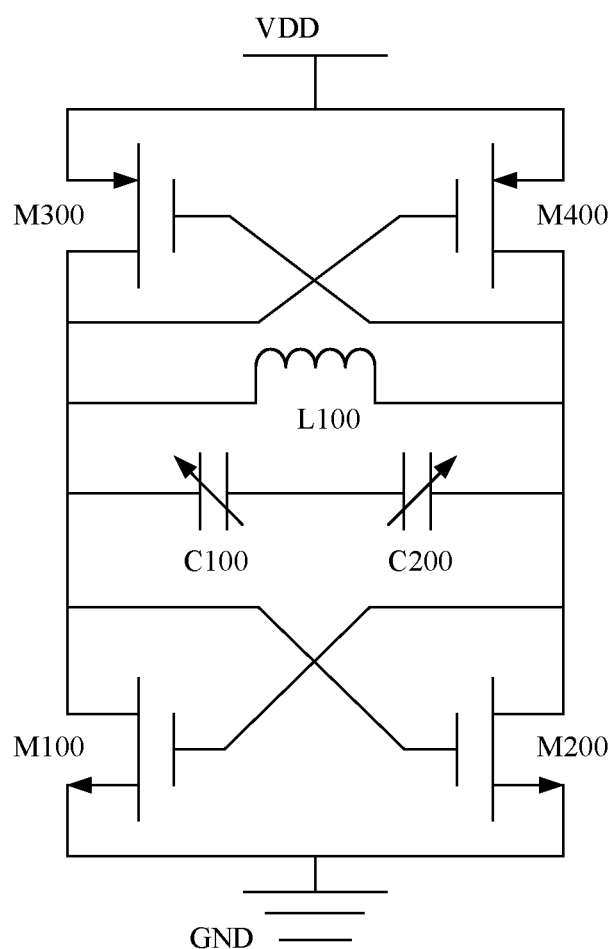
FIG. 1 is a schematic diagram of a voltage-controlled oscillator in the conventional technology.

In the technical solution shown in FIG. 4, the first capacitor C1 crosses an upper signal path and a lower signal path, each signal path includes an inverse amplification element and an inductive element, and structures of the two signal paths are symmetrically disposed to obtain differential output. In this way, an equivalent inductance of an entire structure is halved, an equivalent capacitance of the entire structure is doubled, signal energy is improved, and a better phase noise suppression feature can be obtained. Because the reverse amplification elements in the two signal paths are configured as self-feedback structures, compared with a conventional voltage-controlled oscillator having a cross-coupled structure, the voltage-controlled oscillator has higher current conversion efficiency. In this way, a better phase noise suppression feature can be obtained. In addition, compared with the conventional voltage-controlled oscillator having the cross-coupled structure shown in FIG. 1, this structure can also better suppress pulling. Especially, as an area of a radio frequency chip in which the radio frequency circuit 01 is located becomes smaller and more radio frequency paths exist to support multiple-input multiple-output (MIMO), when a plurality of phase-locked loops work at the same time, pulling is generated between the plurality of phase-locked loops. The voltage-controlled oscillator provided in this embodiment may be well used in the phase-locked loops and helps suppress the pulling, to improve system performance.

Figure 5:
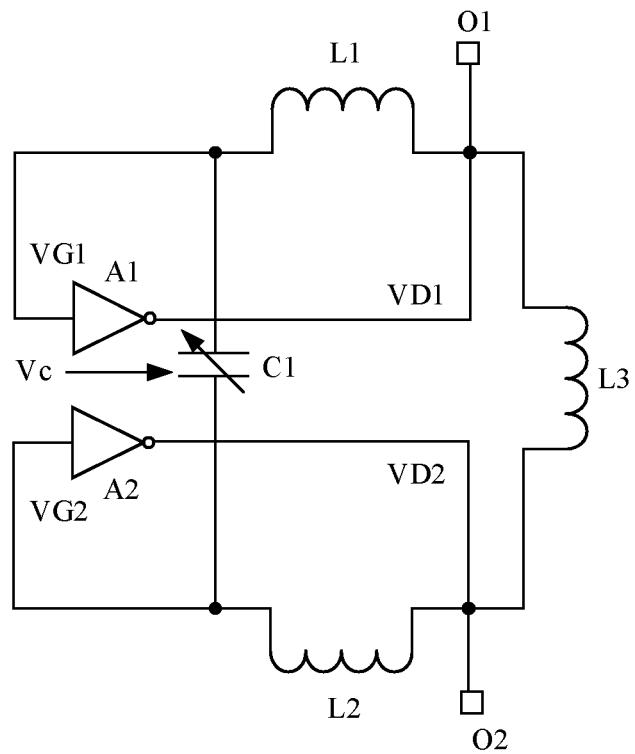
FIG. 5 is a schematic diagram of another voltage-controlled oscillator according to an embodiment of this application.
Figure 6:
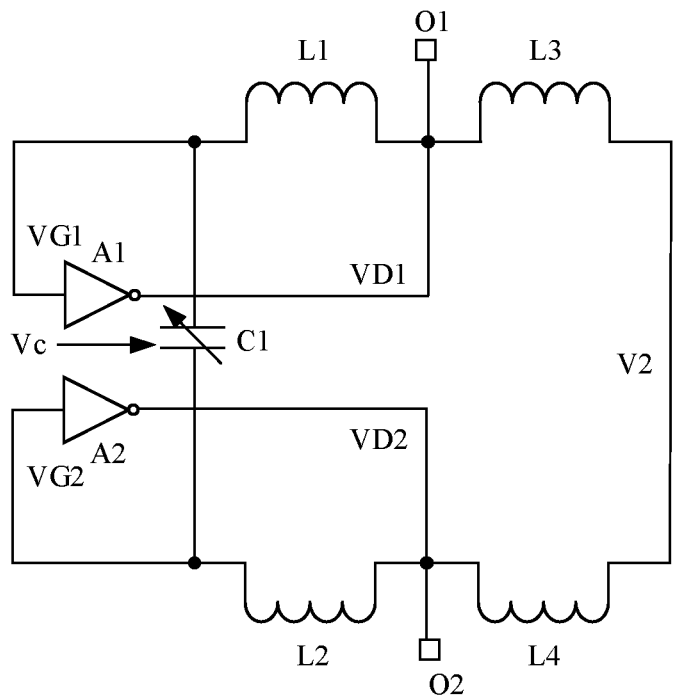
FIG. 6 is a schematic diagram of still another voltage-controlled oscillator according to an embodiment of this application.

Further, in an implementation solution, as shown in FIG. 5, the first inductive element 41 includes a first inductor L1, the second inductive element 42 includes a second inductor L2, and the third inductive element 43 includes a third inductor L3. In another implementation solution, as shown in FIG. 6, a difference from FIG. 5 lies in that, the third inductive element 43 includes a third inductor L3 and a fourth inductor L4. The third inductor L3 and the fourth inductor L4 are coupled to a second node having a second reference voltage V2.

For example, the first capacitor C1 in FIG. 4 to FIG. 6 has a variable capacitor, namely, a capacitor with a variable capacitance value. The capacitance value of the variable capacitor varies with the first voltage signal Vc. Alternatively, the first capacitor C1 may alternatively be implemented by using a capacitive element having a variable capacitance feature other than the variable capacitor, for example, a switch-capacitor network or a variable capacitance diode. Correspondingly, the first voltage signal Vc may be replaced with another type of control signal, for example, may be replaced with a switch control signal, such as a digital logic signal, to change a status of one or more switches in the switch-capacitor network, so as to change a coupling relationship of a plurality of capacitors in the switch-capacitor network to obtain different capacitance values. A capacitor in the switch-capacitor network may be a common metal-oxide-metal (MOM) capacitor, a metal-insulator-metal (MIM) capacitor, a MOS capacitor, or a parasitic capacitor. This is not limited in this embodiment. A typical implementation solution of a capacitive element in this embodiment and subsequent embodiments is a capacitor, but does not constitute a limitation, as long as the capacitive element includes an element having a capacitance value; and optionally, the capacitance value may be changed by a control signal. A type of the control signal depends on a type of the capacitive element, and the control signal may be a digital signal or an analog signal. For example, when the control signal is a voltage signal, the control signal is used to adjust a capacitance value of the variable capacitor, to implement a function of the voltage-controlled oscillator. When the control signal is a digital signal, a capacitance value of the switch-capacitor network may be controlled, to implement digital control. In this case, the oscillator may be considered as a digital-analog mixed oscillator. A digitally-controlled oscillator may be used in a digital phase-locked loop, and the digital phase-locked loop may be used to replace the analog phase-locked loop shown in FIG. 3. For a specific implementation solution of the digital phase-locked loop, refer to the conventional technology, and details are not described herein in this embodiment.

Figure 7:
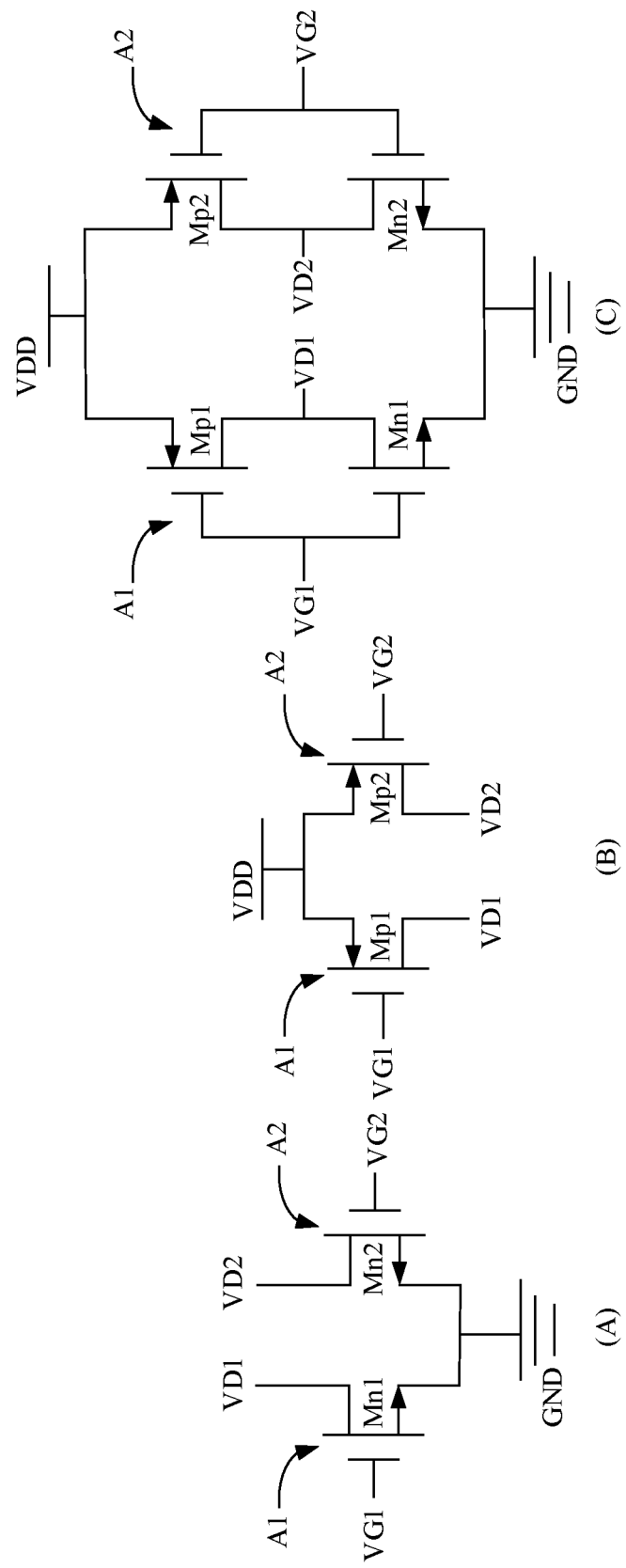
FIG. 7 is a schematic diagram of a plurality of reverse amplification elements used for a voltage-controlled oscillator according to an embodiment of this application.

With reference to a structure in FIG. 6, (A) in FIG. 7 and (B) in FIG. 7 show two implementations of the two reverse amplification elements A1 and A2. The implementations of the reverse amplification elements are applied to the structure in FIG. 6. The first reverse amplification element A1 includes a first MOS transistor, the first input end VG1 is a gate of the first MOS transistor, and the first output end VD1 is a drain of the first MOS transistor. The second reverse amplification element A2 includes a second MOS transistor, the second input end VG2 is a gate of the second MOS transistor, and the second output end VD2 is a drain of the second MOS transistor. In (A) in FIG. 7, the first MOS transistor and the second MOS transistor are NMOS transistors Mn1 and Mn2. If a first reference voltage input by sources of the two NMOS transistors Mn1 and Mn2 is a ground voltage GND or a zero voltage, the second reference voltage V2 in FIG. 6 may be a reference voltage source VDD. In (B) in FIG. 7, the first MOS transistor and the second MOS transistor are PMOS transistors Mp1 and Mp2. If a first reference voltage input by sources of the two PMOS transistors Mp1 and Mp2 is a reference constant voltage source VDD, the second reference voltage V2 may be a ground voltage. In (A) in FIG. 7 or (B) in FIG. 7, the sources of the transistors in the two reverse amplification elements A1 and A2 are coupled only to a first node having the first reference voltage, the drains of the transistors in the two reverse amplification elements A1 and A2 are coupled to the second node having the second reference voltage by using the third inductor L3 and the fourth inductor L4, to form a voltage difference between the two reference voltages. The voltage difference forms a current path between the two reference voltages. The two reverse amplification elements A1 and A2 shown in (A) in FIG. 7 or (B) in FIG. 7 can be well applied to the structure shown in FIG. 6.

In circuit portions (A) in FIG. 7 and (B) in FIG. 7, one MOS transistor is used to implement a reverse amplification function. In an alternative implementation solution, the MOS transistor may be replaced with another type of amplifier component. Further, with reference to a structure in FIG. 5, because the third inductor L3 is not coupled to any node having a reference voltage, the two reverse amplification elements A1 and A2 do not form a current path from the reference voltage source VDD to the ground voltage GND by using the third inductor L3. In this case, each of the two reverse amplification elements A1 and A2 may include a CMOS inverter coupled between the first node having the first reference voltage and the second node having the second reference voltage. The first reference voltage may be one of the reference voltage source VDD and the ground voltage GND, and the second reference voltage is the other one of the reference voltage source VDD and the ground voltage GND. A specific implementation is shown in (C) in FIG. 7. The first inverse amplification element A1 includes a first CMOS inverter, and the first CMOS inverter is coupled between a node having the reference voltage source VDD and a node having the ground voltage GND. The second inverse amplification element A2 includes a second CMOS inverter, and the second CMOS inverter is coupled between the node having the reference voltage source VDD and the node having the ground voltage GND.

In (C) in FIG. 7, the first CMOS inverter includes a PMOS transistor Mp1 and an NMOS transistor Mn1 that are connected in series. The second CMOS inverter includes a PMOS transistor Mp2 and an NMOS transistor Mn2 that are connected in series. A gate of the PMOS transistor Mp1 is coupled to a gate of the NMOS transistor Mn1 and used as the first input end VG1 of the first CMOS inverter, and a drain of the PMOS transistor Mp1 is coupled to a drain of the NMOS transistor Mn1 and used as the first output end VD1 of the first CMOS inverter. A gate of the PMOS transistor Mp2 is coupled to a gate of the NMOS transistor Mn2 and used as the second input end VG2 of the second CMOS inverter, and a drain of the PMOS transistor Mp2 is coupled to a drain of the NMOS transistor Mn2 and used as the second output end VD2 of the second CMOS inverter. In this example, each CMOS inverter has a current path from the reference voltage source VDD to the ground voltage GND, and can support the structure shown in FIG. 5.

In FIG. 6, the first inductor L1 and the third inductor L3 may be two inductors formed by conducting wires. The two inductors L1 and L3 may be independent inductors. In other words, the two inductors L1 and L3 are formed by two independent conducting wires. The two inductors L1 and L3 may alternatively be combined to form a multi-port inductor. In other words, the two inductors L1 and L3 are formed by one conducting wire, and different inductors correspond to different parts of the conducting wire. In this way, an implementation is simple. Implementations of the second inductor L2 and the fourth inductor L4 are similar to implementations of the first inductor L1 and the third inductor L3, and details are not described herein again. Optionally, if the two inductors L1 and L3 are implemented by using independent inductors, each inductor may alternatively be implemented by using an off-chip inductor.

Figure 8:
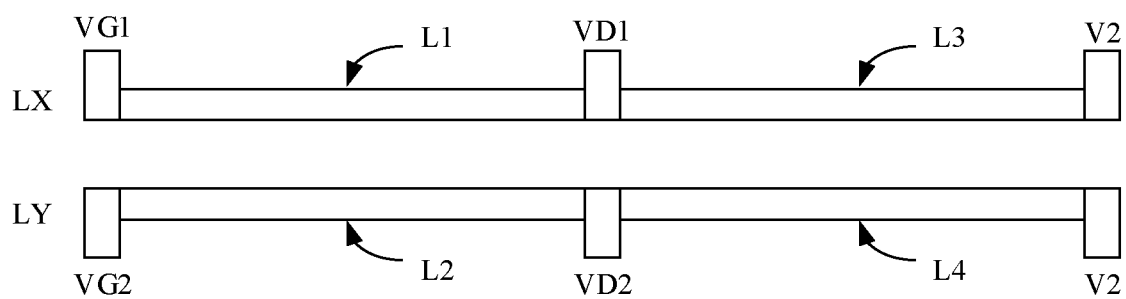
FIG. 8 is a schematic diagram of a layout of a pair of multi-port inductors used for a voltage-controlled oscillator according to an embodiment of this application.
Figure 9:
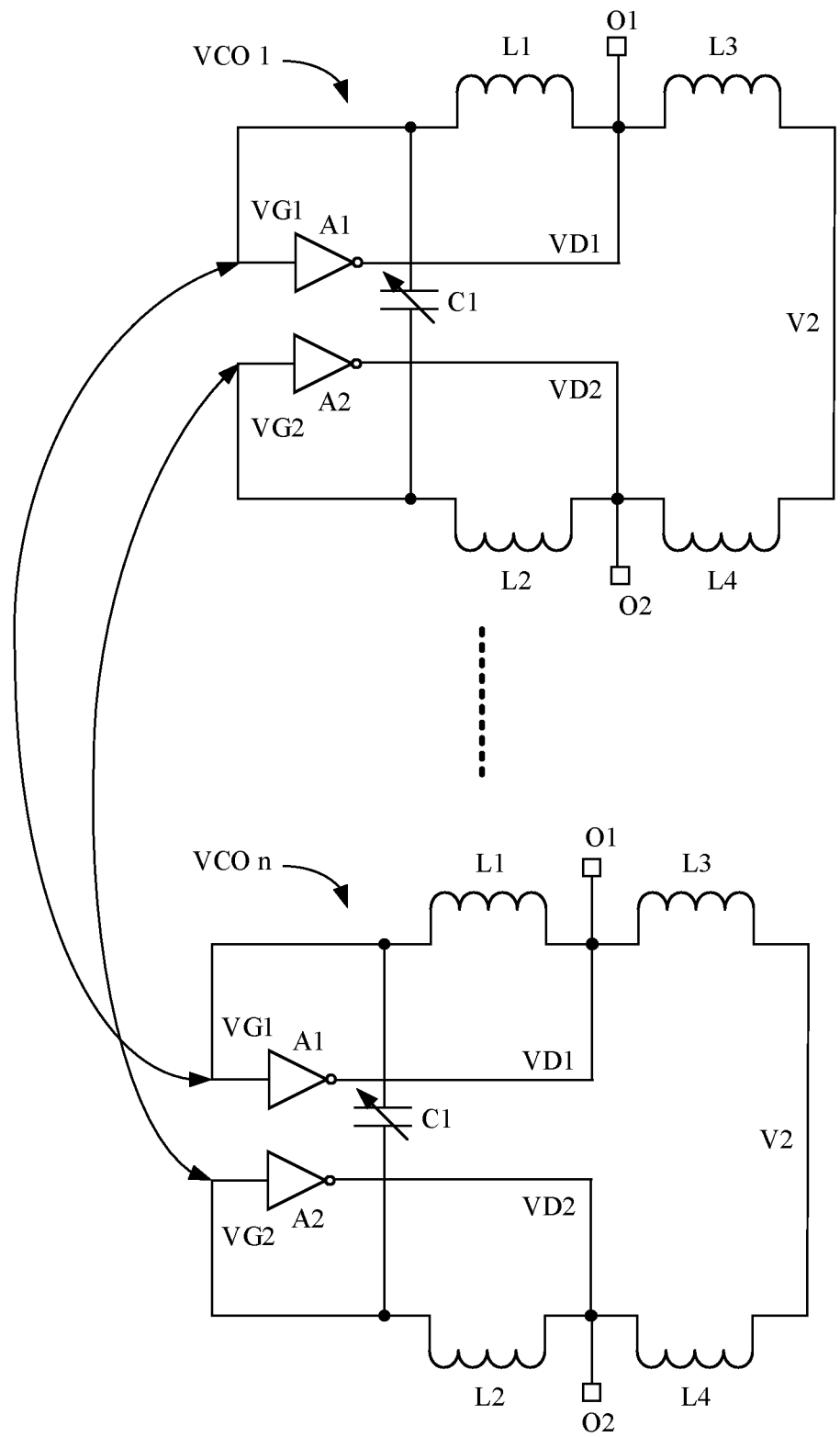
FIG. 9 is a schematic diagram of a parallel structure of a voltage-controlled oscillator according to an embodiment of this application.

For a solution using a multi-port inductor design, specifically refer to FIG. 8. The first inductor L1 and the second inductor L2 are formed in a first multi-port inductor LX. The first multi-port inductor LX is a conducting wire, and a plurality of ports (or referred to as taps) on the first multi-port inductor LX are the first input end VG1, the first output end VD1, and the second node having the second reference voltage V2. The third inductor L3 and the fourth inductor L4 are formed in a second multi-port inductor LY. The second multi-port inductor LY is a conducting wire, and a plurality of ports on the second multi-port inductor LY are the second input end VG2, the second output end VD2, and the second node having the second reference voltage V2. The second nodes having the second reference voltage V2 on the two conducting wires may be coupled to each other, as shown in FIG. 6. The first multi-port inductor LX and the second multi-port inductor LY are symmetrical in structure, and form a pair of multi-port inductors, so that the voltage-controlled oscillator forms a differential structure. It should be understood that the voltage-controlled oscillator 341 shown in FIG. 3 does not show a differential signal. Actually, the output signal O generated by the voltage-controlled oscillator 341 may include the first oscillation signal output by the first signal output end O1 and the second oscillation signal output by the second signal output end O2, as shown in FIG. 4, FIG. 5, FIG. 6, FIG. 9, FIG. 10, FIG. 12, or FIG. 14. In other words, the output signal O of the voltage-controlled oscillator 341 may be a differential signal.

It should be understood that, in addition to a straight line shown in the figure, the conducting wire in FIG. 8 may alternatively be in another shape, for example, an arc or a coil. This is not limited in this embodiment, and the schematic diagram in FIG. 8 is only for understanding. In the foregoing embodiment, an inductor is formed by one conducting wire. This is flexible and convenient, and has low costs.

Another embodiment of this application provides a parallel structure of a voltage-controlled oscillator. For details, refer to FIG. 9. The parallel structure includes n voltage-controlled oscillators shown in FIG. 6, and the n voltage-controlled oscillators are a VCO 1 to a VCO n. n is a quantity of voltage-controlled oscillators in the parallel structure, and is specifically an integer greater than 1. For example, a value of n is 2. A plurality of first input ends VG1 of the n voltage-controlled oscillators are coupled to each other, and a plurality of second input ends VG2 of the plurality of voltage-controlled oscillators are coupled to each other. A first capacitor C1 in each of the n voltage-controlled oscillators receives the first voltage signal Vc, first signal output ends O1 of then voltage-controlled oscillators are coupled to each other, and second signal output ends O2 of the n voltage-controlled oscillators are coupled to each other, so that the n voltage-controlled oscillators work in parallel. This parallel structure can further reduce system noise and improve performance. It should be learned that the parallel structure is described only by using the voltage-controlled oscillator in FIG. 6 as an example. A voltage-controlled oscillator used in an actual application may also be the voltage-controlled oscillator in FIG. 4 or FIG. 5. This is not limited in this embodiment.

Figure 10:
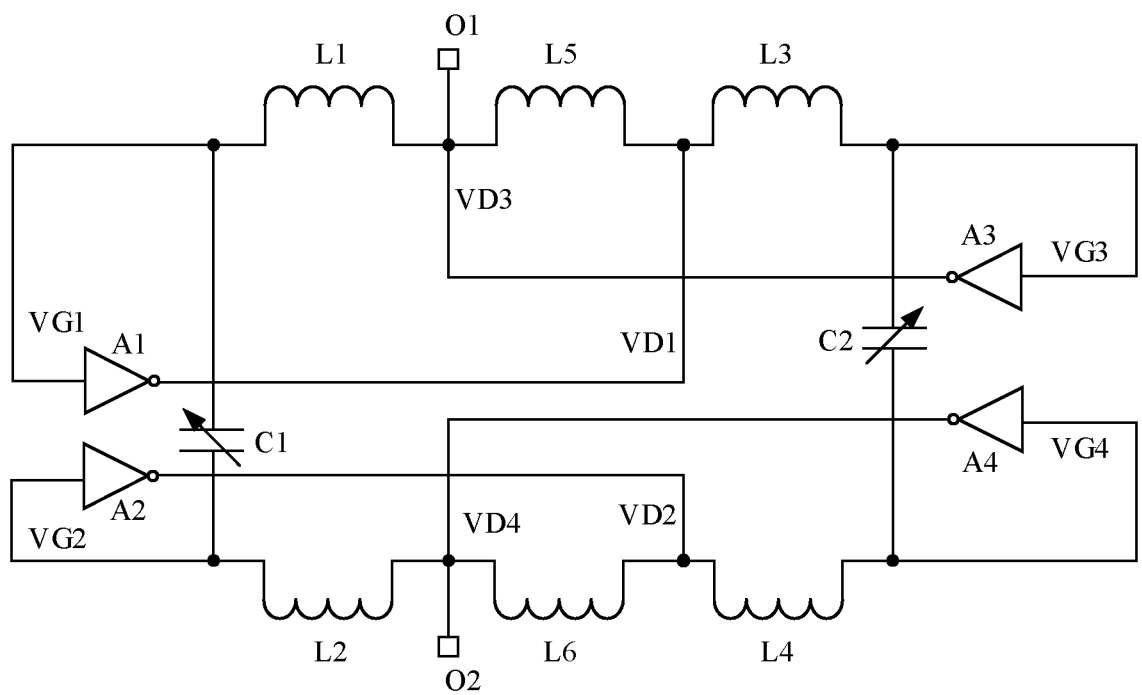
FIG. 10 is a schematic diagram of yet another voltage-controlled oscillator according to an embodiment of this application.

Another embodiment of this application provides a voltage-controlled oscillator. As shown in FIG. 10, the voltage-controlled oscillator includes the first reverse amplification element A1, the second reverse amplification element A2, a third reverse amplification element A3, and a fourth reverse amplification element A4. The first inductive element 41 includes a first inductor L1 and a fifth inductor L5, the second inductive element 42 includes a second inductor L2 and a sixth inductor L6, and the third inductive element 43 includes a third inductor L3 and a fourth inductor L4. The voltage-controlled oscillator further includes a first capacitor C1 and a second capacitor C2. A difference between a structure of the voltage-controlled oscillator in FIG. 10 and the structure in FIG. 6 lies in that the two reverse amplification elements A3 and A4 are added. In addition, the third inductor L3 and the fourth inductor L4 in the third inductive element 43 are not directly connected, but are coupled to each other by using the two reverse amplification elements A3 and A4. This structure is equivalent to connecting the first reverse amplification element A1 and the third reverse amplification element A3 in series and connecting the second reverse amplification element A2 and the fourth reverse amplification element A4 in series, so that a current can circulate between the first reverse amplification element A1 and the third reverse amplification element A3, and circulate between the second reverse amplification element A2 and the fourth reverse amplification element A4. In this way, current multiplexing is implemented, current utilization efficiency is improved, a swing is increased, and a noise suppression feature is further improved.

In FIG. 10, the third reverse amplification element A3 includes a third input end VG3 and a third output end VD3, the fourth inverting amplification element A4 includes a fourth input end VG4 and a fourth output end VD4, and the second capacitor C2 is coupled between the third input end VG3 and the fourth input end VG4. The first inductor L1 is coupled between the first input end VG1 and the third output end VD3, the second inductor L2 is coupled between the second input end VG2 and the fourth output end VD4, the third inductor L3 is coupled between the first output end VD1 and the third input end VG3, the fourth inductor L4 is coupled between the second output end VD2 and the fourth input end VG4, the fifth inductor L5 is coupled between the first output end VD1 and the third output end VD3, and the sixth inductor L6 is coupled between the second output end VD2 and the fourth output end VD4.

In FIG. 10, an upper signal path and a lower signal path enable the voltage-controlled oscillator to have a differential structure as a whole. For example, the upper signal path includes the first reverse amplification element A1, the third reverse amplification element A3, the first inductor L1, the third inductor L3, and the fifth inductor L5, so that a current can circulate between the first reverse amplification element A1 and the third reverse amplification element A3, to implement current multiplexing. The lower signal path and the upper signal path are symmetrically disposed, to implement differential working. Similar to FIG. 6, the first capacitor C1 is coupled between the first input end VG1 and the second input end VG2, in other words, bridged between the two signal paths. Further, in FIG. 10, the second capacitor C2 is coupled between the third input end VG3 and the fourth input end VG4, in other words, bridged between the two signal paths.

In FIG. 10, both the first capacitor C1 and the second capacitor C2 elements can be controlled to change their own capacitance values. For example, the second capacitor C2 is controlled by a second voltage signal, and the second voltage signal is used to adjust the capacitance value of the second capacitor. Similar to the first voltage signal Vc, the second voltage signal is a second control signal. The two control signals adjust the capacitance values of the two capacitors, to adjust the frequency of the output signal of the voltage-controlled oscillator, to improve adjustment flexibility. In this case, refer to FIG. 3. The voltage-controlled oscillator 314 inputs two control signals Vc, in other words, includes one first voltage signal Vc and one second voltage signal. Although FIG. 3 shows this, an implementation of the technical solution is not affected.

Further, optionally, if the voltage-controlled oscillator 314 is implemented by using a digitally-controlled oscillator, the control signal also includes two digitally-controlled signals, and a corresponding capacitive element includes a controllable switch-capacitor network. For details, refer to descriptions in the foregoing embodiment. Details are not described herein again.

Alternatively, in the two capacitors in this embodiment, only one capacitor may be adjustable, and the other capacitor is not adjusted by the control signal. For example, the first capacitor C1 is controlled by the first voltage signal, but the second capacitor C2 is an element with a fixed capacitance value. This does not affect an implementation of this embodiment.

Figure 12:
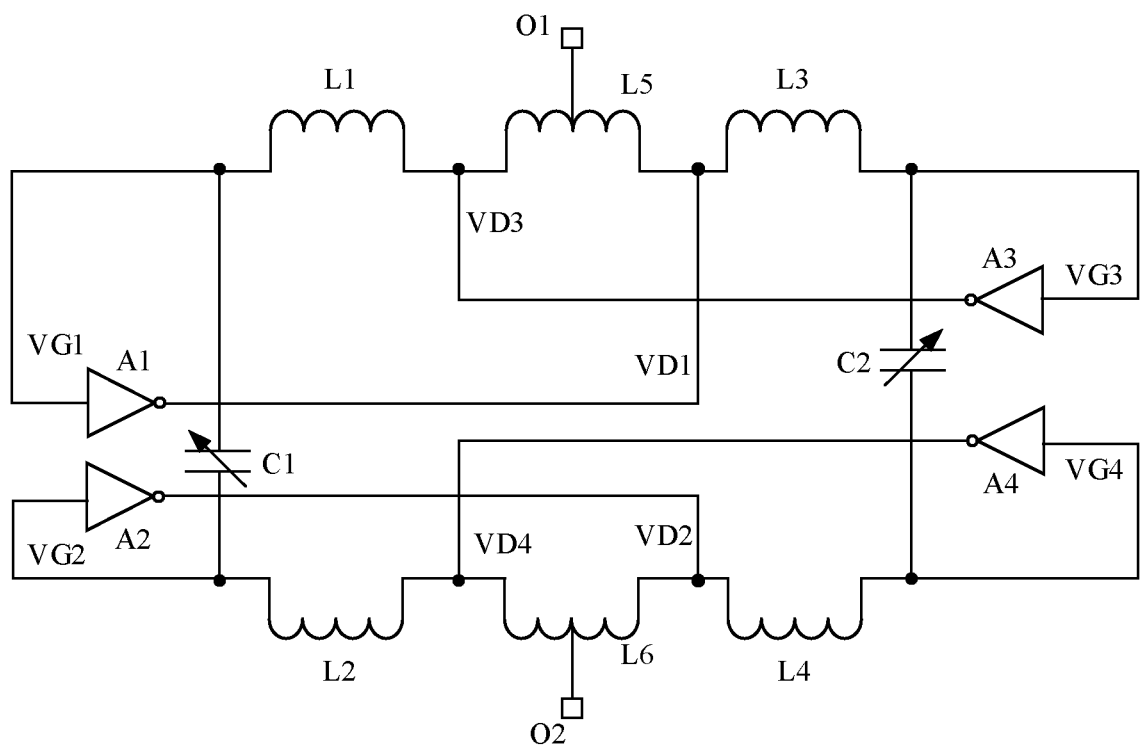
FIG. 12 is a schematic diagram of a further voltage-controlled oscillator according to an embodiment of this application.

For the voltage-controlled oscillator in FIG. 10, the first signal output end O1 may be coupled to either the first inductor L1 or the fifth inductor L5, the second signal output end O2 may be coupled to either the second inductor L2 or the sixth inductor L6, and the first signal output end O1 and the second signal output end O2 are symmetrically disposed. As described above, coupling is a connection in a broad sense, including a direct connection or an indirect connection. Therefore, the first signal output end O1 may be disposed on any inductor or any end of the inductor in the upper signal path, and the second signal output end O2 is disposed in a similar way. For example, in FIG. 10, the first signal output end O1 is coupled between the first inductor L1 and the fifth inductor L5, in other words, coupled to the third output end VD3; and the second signal output end O2 is coupled between the second inductor L2 and the sixth inductor L6, in other words, coupled to the fourth output end VD4. Alternatively, as shown in FIG. 12, different from FIG. 10, the first signal output end O1 and the second signal output end O2 may be disposed on the fifth inductor L5 and the sixth inductor L6. Alternatively, the first signal output end O1 may be set to be the first input end VG1 or the first output end VD1, and in this case, the second signal output end O2 may be set to be the second input end VG2 or the second output end VD2. This is not limited in this embodiment. Any signal output end in this embodiment needs to be disposed on a corresponding signal path, so that an oscillation signal in the signal path can be output to the outside by using the signal output end.

Figure 11:
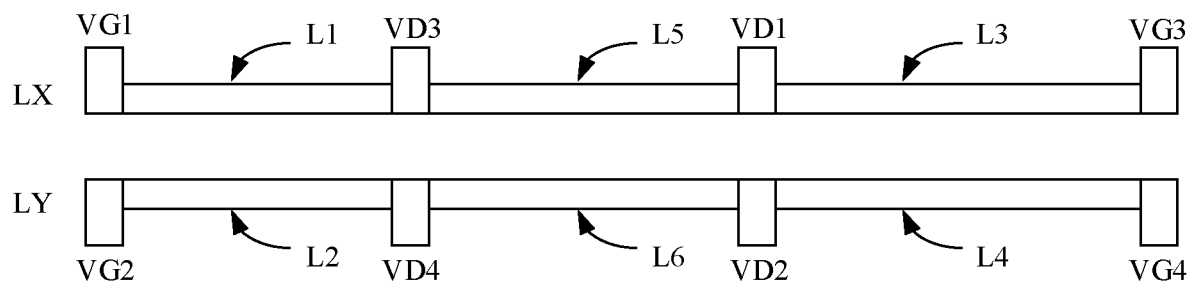
FIG. 11 is a schematic diagram of a layout of another pair of multi-port inductors used for a voltage-controlled oscillator according to an embodiment of this application.

Each of the first inductor L1, the second inductor L2, the third inductor L3, the fourth inductor L4, the fifth inductor L5, and the sixth inductor L6 in FIG. 10 or FIG. 12 is a separate inductor. In other words, each inductor is formed by an independent conducting wire. Alternatively, if these inductors are implemented by using independent inductors, each inductor may also be implemented by using an off-chip inductor. In another implementation solution, a multi-port inductor similar to that in FIG. 8 may be disposed. To be specific, a plurality of inductors may be formed by one conducting wire, and an implementation is simple. FIG. 11 specifically shows an implementation of the plurality of inductors in the structure in FIG. 10. The first inductor L1, the third inductor L3, and the fifth inductor L5 are formed in the first multi-port inductor LX, and the second inductor L2, the fourth inductor L4, and the sixth inductor L6 are formed in the second multi-port inductor LY. The pair of multi-port inductors LX and LY is symmetrically disposed. Each multi-port inductor is a conducting wire. A shape of the conducting wire in FIG. 11 is not limited. In addition to a straight line shape shown in the figure, the conducting wire may also be an arc or a coil. An inductor is formed by one conducting wire, so that a design is flexible and convenient, and costs are low. Specifically, in FIG. 11, the first multi-port inductor LX includes the first input end VG1, the first output end VD1, the third input end VG3, and the third output end VD3; and the second multi-port inductor LY includes the second input end VG2, the second output end VD2, the fourth input end VG4, and the fourth output end VD4. For a structure of the voltage-controlled oscillator in FIG. 10, the first signal output end O1 and the second signal output end O2 may be coupled to or may be the third output end VD3 and the fourth output end VD4.

Figure 13:
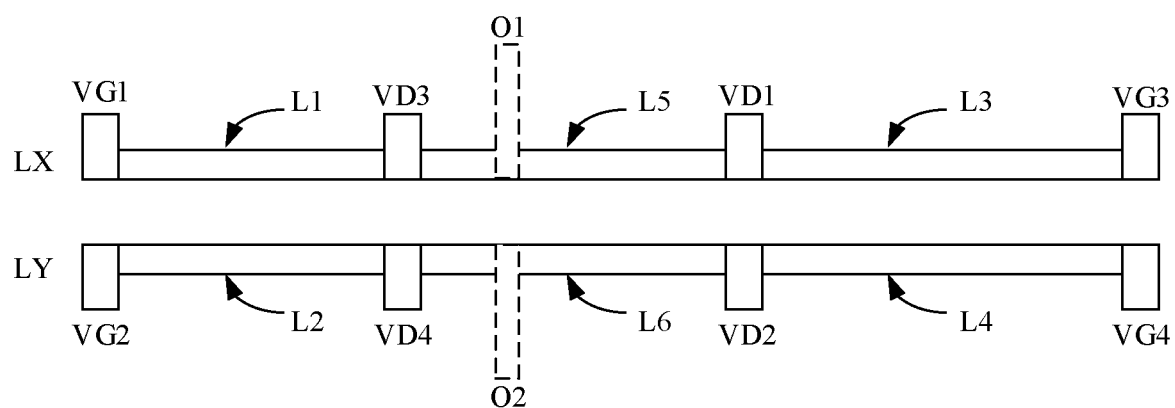
FIG. 13 is a schematic diagram of a layout of still another pair of multi-port inductors used for a voltage-controlled oscillator according to an embodiment of this application.

Further, FIG. 13 shows an implementation of the plurality of inductors in the structure in FIG. 12. Different from FIG. 11, the first signal output end O1 and the second signal output end O2 in FIG. 13 are not the third output end VD3 and the fourth output end VD4, but the first signal output end O1 and the second signal output end O2 are led out from the fifth inductor L5 and the sixth inductor L6, so that the first signal output end O1 and the second signal output end O2 are symmetrically disposed in the upper signal path and the lower signal path of the voltage-controlled oscillator shown in FIG. 12. Therefore, the multi-port inductors in FIG. 13 have two more signal output ports than the two multi-port inductors in FIG. 11, but this does not affect an effect of the embodiment. A port involved in the foregoing description may also be referred to as a tap.

Figure 14:
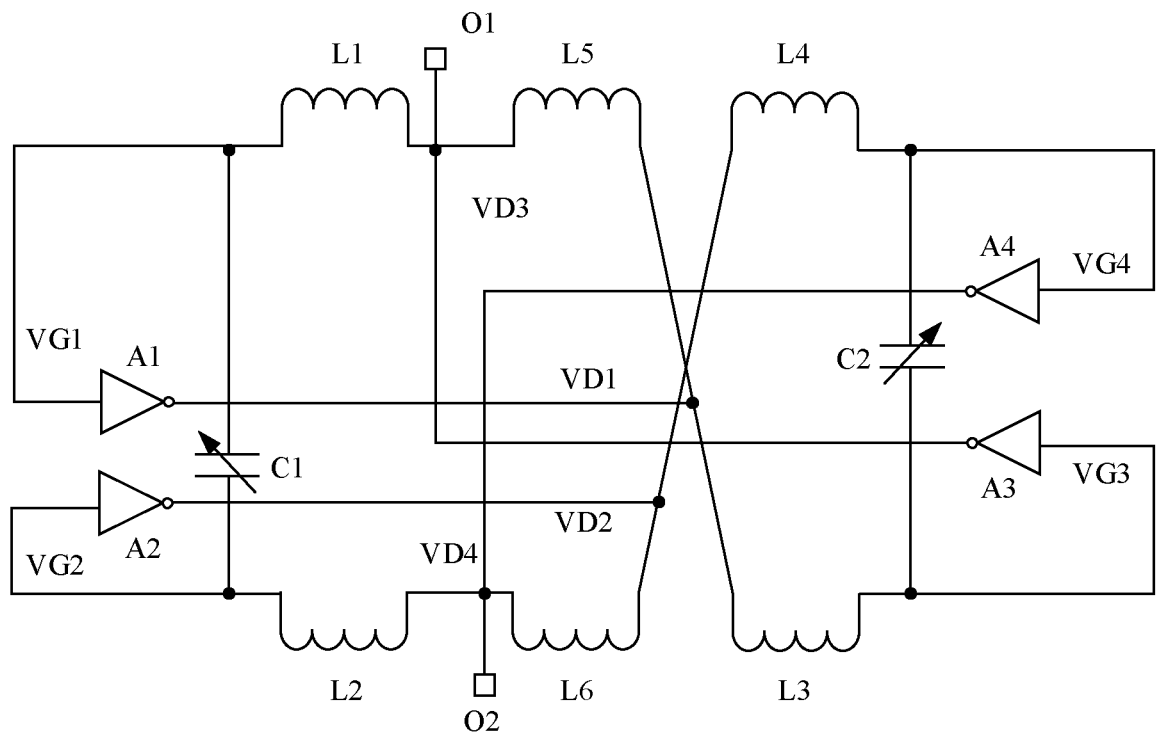
FIG. 14 is a schematic diagram of a still further voltage-controlled oscillator according to an embodiment of this application.
Figure 15:
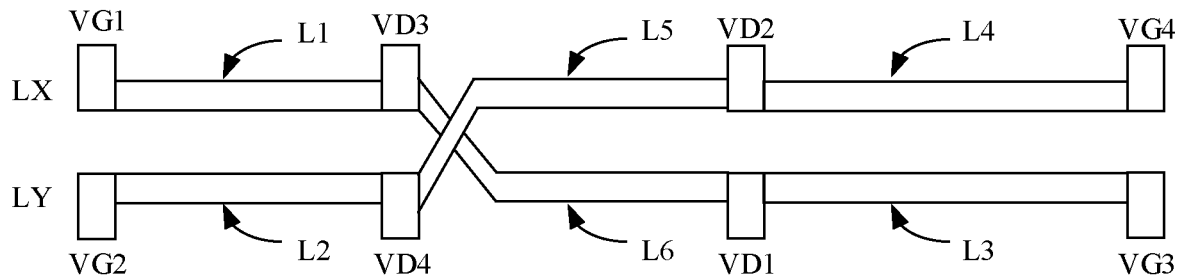
FIG. 15 is a schematic diagram of a layout of a pair of multi-port inductors that is used for a voltage-controlled oscillator and that has a cross-arranged structure according to an embodiment of this application.

FIG. 14 is a schematic diagram of a structure of another differential voltage-controlled oscillator according to an embodiment of this application. A difference between FIG. 14 and FIG. 10 lies in that the voltage-controlled oscillator in FIG. 14 uses an implementation in which inductors in the upper path and the lower path cross each other, and a circuit topology structure of the voltage-controlled oscillator in FIG. 14 is essentially the same as that in FIG. 10. However, in terms of a layout implementation, disposition of the plurality of inductors of the voltage-controlled oscillator in FIG. 14 is changed. Specifically, as shown in FIG. 15, the first multi-port inductor LX and the second multi-port inductor LY have cross-arranged structures, so that the first signal path including the first reverse amplification element A1, the third reverse amplification element A3, the first inductor L1, the second inductor L2, and the fifth inductor L5 and the second signal path including the second reverse amplification element A2, the fourth reverse amplification element A4, the third inductor L3, the fourth inductor L4, and the sixth inductor L6 are crossed in a layout. In other words, the two multi-port inductors LX and LY shown in FIG. 15 use an "8"-shaped coupling structure. A cross-location of the "8"-shaped coupling structure is disposed on the fifth inductor L5 and the sixth inductor L6 in FIG. 15. This "8"-shaped layout design helps to improve an anti-interference capability of the voltage-controlled oscillator and reduce energy leakage of the inductor.

Figure 16:
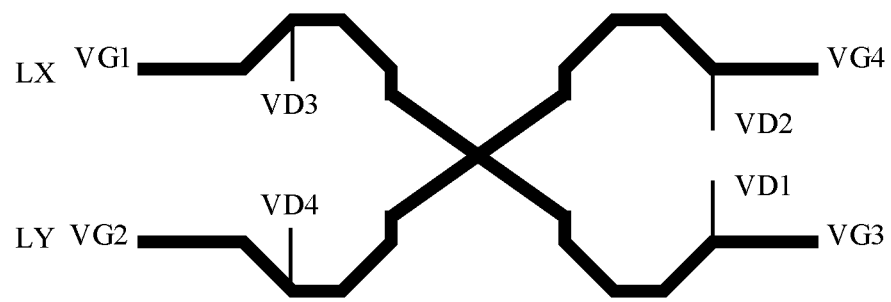
FIG. 16 is a schematic diagram of a layout of another pair of multi-port inductors that has a cross-arranged structure according to an embodiment of this application.

FIG. 16 is a schematic diagram of a layout of a pair of "8"-shaped multi-port inductors having a cross-arranged structure. Different from the schematic diagram of the layout shown in FIG. 8, FIG. 11, FIG. 13, or FIG. 15, conducting wires by which the multi-port inductors are formed in the layout in FIG. 16 are not straight lines, but have specific shapes. This does not change essence of the technical solution.

Both the first capacitor C1 and the second capacitor C2 in FIG. 10, FIG. 12, and FIG. 14 may be variable capacitors, or only one of the first capacitor C1 and the second capacitor C2 may be a variable capacitor. The variable capacitor can receive an input signal of the voltage-controlled oscillator, and is controlled by the input signal to change a frequency of an output signal of the voltage-controlled oscillator. As described above, any variable capacitor may also be implemented by an element having a variable capacitance feature, for example, the switch-capacitor network or the variable capacitor diode. For example, a state of one or more switches in the switch-capacitor network may be controlled by the input signal, to change a capacitance value of the switch-capacitor network. This is not limited in this embodiment.

For implementations of the plurality of reverse amplification elements involved in FIG. 10, FIG. 12, and FIG. 14, further refer to the structure shown in FIG. 7. (A) in FIG. 7, (B) in FIG. 7, and (C) in FIG. 7 show designs of the reverse amplification elements of three differential structures. Specifically, FIG. 10 is used as an example. The first reverse amplification element A1 and the second reverse amplification element A2 form a differential structure, and the third reverse amplification element A3 and the fourth reverse amplification element A4 form another differential structure.

With reference to FIG. 10, FIG. 12, and FIG. 14, for example, the first reverse amplification element A1 and the second reverse amplification element A2 may use a differential structure implemented by the NMOS transistor in (A) in FIG. 7, and the first reference voltage input by the source of the NMOS transistor is the ground voltage GND. In this case, the third reverse amplification element A3 and the fourth reverse amplification element A4 may use a differential structure implemented by the PMOS transistor in (B) in FIG. 7, and the second reference voltage input by the source of the PMOS transistor is the reference voltage source VDD. On the contrary, in another example, the first reverse amplification element A1 and the second reverse amplification element A2 may use the differential structure implemented by the PMOS transistor in (B) in FIG. 7, and the first reference voltage input by the source of the PMOS transistor is the reference voltage source VDD. In this case, the third reverse amplification element A3 and the fourth reverse amplification element A4 may use the differential structure implemented by the NMOS transistor in (A) in FIG. 7, and the second reference voltage input by the source of the NMOS transistor is the ground voltage GND.

Alternatively, with reference to FIG. 10, FIG. 12, and FIG. 14, in another example, the first reverse amplification element A1 and the second reverse amplification element A2 use a structure of the CMOS inverter in (C) in FIG. 7, and the third reverse amplification element A3 and the fourth reverse amplification element A4 also use the structure of the CMOS inverter in (C) in FIG. 7. In other words, the CMOS inverter is coupled between the first node having the first reference voltage and the second node having the second reference voltage. For example, the first reference voltage is the reference voltage source VDD, and the second reference voltage is the ground voltage GND. Specifically, the CMOS inverter includes the PMOS transistor and the NMOS transistor that are connected in series. In other words, the drain of the PMOS transistor and the drain of the NMOS transistor are coupled and used as the output end of the CMOS inverter, the source of the PMOS transistor receives the reference voltage source VDD, the source of the NMOS transistor receives the ground voltage GND, and the gate of the PMOS transistor and the gate of the NMOS transistor are coupled and used as the input end of the CMOS inverter. For specific descriptions of the structure of the CMOS inverter, refer to the descriptions in the foregoing embodiments. Details are not described herein again.

The reverse amplification element involved in the foregoing embodiments uses a simplest structure of an NMOS transistor, a PMOS transistor, or a CMOS inverter. A single transistor of the NMOS transistor or the PMOS transistor is used to implement an amplification function, and a structure design is simple. The CMOS inverter is used to implement the amplification function, which helps to improve performance. Alternatively, the reverse amplification element may actually also use a more complex reverse amplifier structure. For example, the reverse amplifier may also include other elements in addition to an MOS transistor, for example, include a bipolar transistor. An inductor involved in the foregoing embodiments may be implemented in a manner other than by one conducting wire. In other words, the inductor may also be implemented by using another type of process or component, for example, implemented by using an off-chip inductor.

In the foregoing embodiments, the technical solutions of this application are described by using examples. Compared with a conventional solution, a related solution can better suppress phase noise and pulling. For example, a related reverse amplification element may be based on the PMOS transistor, the NMOS transistor, or the CMOS inverter, and may form a class AB structure, so that any transistor may be in a state between fully-conducted and half-conducted during working, and current conversion efficiency is better than that in the conventional solution. Therefore, a better phase noise feature can be obtained. In addition, the foregoing structure is easy to implement, and in terms of an area and power consumption, the solution in this embodiment also has advantages over the conventional solution.

The foregoing embodiments are merely used to describe the technical solutions of this application, but not to limit this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the scope of the technical solutions of embodiments of this application. For example, for some specific operations in the apparatus embodiment, refer to the foregoing method embodiments.

The invention claimed is:

1. An oscillator, comprising:
   a first reverse amplification element, comprising a first input end and a first output end;
   a second reverse amplification element, comprising a second input end and a second output end;
   a first inductive element coupled between the first input end and the first output end;
   a second inductive element coupled between the second input end and the second output end;
   a third inductive element coupled between the first output end and the second output end;
   a first capacitive element, coupled between the first input end and the second input end and coupled to receive a first control signal, wherein the first control signal is used to adjust a capacitance value of the first capacitive element;
   a first signal output end, coupled to the first inductive element to output a first oscillation signal;
   a second signal output end, coupled to the second inductive element to output a second oscillation signal, wherein the first oscillation signal and the second oscillation signal jointly form a differential output oscillation signal;
   wherein the first inductive element comprises a first inductor and a fifth inductor, the second inductive element comprises a second inductor and a sixth inductor, and the third inductive element comprises a third inductor and a fourth inductor; and
   the oscillator further comprises:
      a third reverse amplification element, comprising a third input end and a third output end;
      a fourth reverse amplification element, comprising a fourth input end and a fourth output end; and
      a second capacitive element coupled between the third input end and the fourth input end, wherein
      the first inductor is coupled between the first input end and the third output end, the second inductor is coupled between the second input end and the fourth output end, the third inductor is coupled between the first output end and the third input end, the fourth inductor is coupled between the second output end and the fourth input end, the fifth inductor is coupled between the first output end and the third output end, and the sixth inductor is coupled between the second output end and the fourth output end.

2. The oscillator according to claim 1, wherein the first inductive element comprises a first inductor, the second inductive element comprises a second inductor, and the third inductive element comprises a third inductor and a fourth inductor;
   the first reverse amplification element comprises a first MOS transistor, the first input end is a gate of the first MOS transistor, the first output end is a drain of the first MOS transistor, a source of the first MOS transistor is configured to input a first reference voltage, and the third inductor is coupled between the first output end and a second node having a second reference voltage; and
   the second reverse amplification element comprises a second MOS transistor, the second input end is a gate of the second MOS transistor, the second output end is a drain of the second MOS transistor, a source of the second MOS transistor is configured to input the first reference voltage, and the fourth inductor is coupled between the second output end and the second node having the second reference voltage.

3. The oscillator according to claim 2, wherein the first inductor and the third inductor are formed in a first multi-port inductor, and the second inductor and the fourth inductor are formed in a second multi-port inductor.

4. The oscillator according to claim 3, wherein the first multi-port inductor and the second multi-port inductor are cross-arranged in a layout.

5. The oscillator according to claim 2, wherein one of the first reference voltage and the second reference voltage is a ground voltage and the other is a reference voltage source.

6. The oscillator according to claim 1, wherein the first inductive element comprises a first inductor, the second inductive element comprises a second inductor, and the third inductive element comprises at least one third inductor;
   the first reverse amplification element comprises a first CMOS inverter coupled between a first node having a first reference voltage and a second node having a second reference voltage; and
   the second reverse amplification element comprises a second CMOS inverter coupled between the first node having the first reference voltage and the second node having the second reference voltage.

7. The oscillator according to claim 1, wherein the second capacitive element is configured to receive a second control signal, wherein the second control signal is used to adjust a capacitance value of the second capacitive element.

8. The oscillator according to claim 1, wherein the first reverse amplification element comprises a first MOS transistor, the first input end is a gate of the first MOS transistor, the first output end is a drain of the first MOS transistor, and a source of the first MOS transistor is configured to input a first reference voltage;

the second reverse amplification element comprises a second MOS transistor, the second input end is a gate of the second MOS transistor, the second output end is a drain of the second MOS transistor, and a source of the second MOS transistor is configured to input the first reference voltage;

the third reverse amplification element comprises a third MOS transistor, the third input end is a gate of the third MOS transistor, the third output end is a drain of the third MOS transistor, a source of the third MOS transistor is configured to input a second reference voltage, and the third MOS transistor and the first MOS transistor are complementary transistors; and the fourth reverse amplification element comprises a fourth MOS transistor, the fourth input end is a gate of the fourth MOS transistor, the fourth output end is a drain of the fourth MOS transistor, a source of the fourth MOS transistor is configured to input the second reference voltage, and the fourth MOS transistor and the second MOS transistor are complementary transistors.

9. The oscillator according to claim 1, wherein the first reverse amplification element comprises a first CMOS inverter coupled between a first node having a first reference voltage and a second node having a second reference voltage;

the second reverse amplification element comprises a second CMOS inverter coupled between the first node having the first reference voltage and the second node having the second reference;

the third reverse amplification element comprises a third CMOS inverter coupled between the first node having the first reference voltage and the second node having the second reference voltage; and the fourth reverse amplification element comprises a fourth CMOS inverter coupled between the first node having the first reference voltage and the second node having the second reference voltage.

10. The oscillator according to claim 1, wherein the first inductor, the third inductor, and the fifth inductor are formed in a first multi-port inductor, and the second inductor, the fourth inductor, and the sixth inductor are formed in a second multi-port inductor.

11. An oscillator circuit structure, comprising:
a plurality of oscillators coupled in parallel, wherein a plurality of first input ends of the plurality of oscillators are coupled to each other, and a plurality of second input ends of the plurality of oscillators are coupled to each other; wherein each of the plurality of oscillators comprises:
a first reverse amplification element, comprising a first input end and a first output end;
a second reverse amplification element, comprising a second input end and a second output end;
a first inductive element coupled between the first input end and the first output end;
a second inductive element coupled between the second input end and the second output end;
a third inductive element coupled between the first output end and the second output end;
a first capacitive element, coupled between the first input end and the second input end and coupled to receive a first control signal, wherein the first control signal is used to adjust a capacitance value of the first capacitive element;
a first signal output end, coupled to the first inductive element and configured to output a first oscillation signal;
a second signal output end, coupled to the second inductive element and configured to output a second oscillation signal, wherein the first oscillation signal and the second oscillation signal jointly form a differential output oscillation signal;

wherein the first inductive element comprises a first inductor and a fifth inductor, the second inductive element comprises a second inductor and a sixth inductor, and the third inductive element comprises a third inductor and a fourth inductor; and the oscillator further comprises:
a third reverse amplification element, comprising a third input end and a third output end;
a fourth reverse amplification element, comprising a fourth input end and a fourth output end; and
a second capacitive element coupled between the third input end and the fourth input end, wherein the first inductor is coupled between the first input end and the third output end, the second inductor is coupled between the second input end and the fourth output end, the third inductor is coupled between the first output end and the third input end, the fourth inductor is coupled between the second output end and the fourth input end, the fifth inductor is coupled between the first output end and the third output end, and the sixth inductor is coupled between the second output end and the fourth output end.

12. The structure according to claim 11, wherein the first inductive element comprises a first inductor, the second inductive element comprises a second inductor, and the third inductive element comprises a third inductor and a fourth inductor;

the first reverse amplification element comprises a first MOS transistor, the first input end is a gate of the first MOS transistor, the first output end is a drain of the first MOS transistor, a source of the first MOS transistor is configured to input a first reference voltage, and the third inductor is coupled between the first output end and a second node having a second reference voltage; and the second reverse amplification element comprises a second MOS transistor, the second input end is a gate of the second MOS transistor, the second output end is a drain of the second MOS transistor, a source of the second MOS transistor is configured to input the first reference voltage, and the fourth inductor is coupled between the second output end and the second node having the second reference voltage.

13. The structure according to claim 11, wherein the first inductive element comprises a first inductor, the second inductive element comprises a second inductor, and the third inductive element comprises at least one third inductor;

the first reverse amplification element comprises a first CMOS inverter coupled between a first node having a first reference voltage and a second node having a second reference voltage; and the second reverse amplification element comprises a second CMOS inverter coupled between the first node having the first reference voltage and the second node having the second reference voltage.

14. The structure according to claim 12, wherein the first inductor and the third inductor are formed in a first multi-port inductor, and the second inductor and the fourth inductor are formed in a second multi-port inductor.

15. The structure according to claim 11, wherein the second capacitive element is configured to receive a second control signal, wherein the second control signal is used to adjust a capacitance value of the second capacitive element.

16. The structure according to claim 11, wherein the first reverse amplification element comprises a first MOS transistor, the first input end is a gate of the first MOS transistor, the first output end is a drain of the first MOS transistor, and a source of the first MOS transistor is configured to input a first reference voltage;
    the second reverse amplification element comprises a second MOS transistor, the second input end is a gate of the second MOS transistor, the second output end is a drain of the second MOS transistor, and a source of the second MOS transistor is configured to input the first reference voltage;
    the third reverse amplification element comprises a third MOS transistor, the third input end is a gate of the third MOS transistor, the third output end is a drain of the third MOS transistor, a source of the third MOS transistor is configured to input a second reference voltage, and the third MOS transistor and the first MOS transistor are complementary transistors; and
    the fourth reverse amplification element comprises a fourth MOS transistor, the fourth input end is a gate of the fourth MOS transistor, the fourth output end is a drain of the fourth MOS transistor, a source of the fourth MOS transistor is configured to input the second reference voltage, and the fourth MOS transistor and the second MOS transistor are complementary transistors.

17. The structure according to claim 11, wherein the first reverse amplification element comprises a first CMOS inverter coupled between a first node having a first reference voltage and a second node having a second reference voltage;
    the second reverse amplification element comprises a second CMOS inverter coupled between the first node having the first reference voltage and the second node having the second reference;
    the third reverse amplification element comprises a third CMOS inverter coupled between the first node having the first reference voltage and the second node having the second reference voltage; and
    the fourth reverse amplification element comprises a fourth CMOS inverter coupled between the first node having the first reference voltage and the second node having the second reference voltage.

18. The structure according to claim 11, wherein the first inductor, the third inductor, and the fifth inductor are formed in a first multi-port inductor, and the second inductor, the fourth inductor, and the sixth inductor are formed in a second multi-port inductor.

* * * * *